US012584952B2

(12) United States Patent　　　(10) Patent No.:　US 12,584,952 B2

Sawada　　　　　　　　　　　　　　(45) Date of Patent:　Mar. 24, 2026

---

(54) MEASURING DEVICE

(71) Applicant: FUJI CORPORATION, Aichi (JP)

(72) Inventor: Toshiyuki Sawada, Toyota (JP)

(73) Assignee: FUJI CORPORATION, Aichi (JP)

( * ) Notice: Subject to any disclaimer, the term of this patent is extended or adjusted under 35 U.S.C. 154(b) by 139 days.

(21) Appl. No.: 18/567,394

(22) PCT Filed: Jun. 14, 2021

(86) PCT No.: PCT/JP2021/022529

§ 371 (c)(1),
(2) Date: Dec. 6, 2023

(87) PCT Pub. No.: WO2022/264214

PCT Pub. Date: Dec. 22, 2022

(65) Prior Publication Data

US 2024/0272221 A1　　Aug. 15, 2024

(51) Int. Cl.
*G01R 31/26*　　　(2020.01)
*H05K 13/08*　　　(2006.01)

(52) U.S. Cl.
CPC ....... *G01R 31/2601* (2013.01); *H05K 13/082* (2018.08)

(58) Field of Classification Search
None
See application file for complete search history.

(56) References Cited

U.S. PATENT DOCUMENTS

| | | | | |
|---|---|---|---|---|
| 4,651,090 A | * | 3/1987 | Heigl ................... | H05K 13/021 |
| | | | | 324/537 |
| 5,290,134 A | * | 3/1994 | Baba .................. | G01R 31/2851 |
| | | | | 414/754 |
| 6,163,145 A | * | 12/2000 | Yamada ............. | G01R 1/06705 |
| | | | | 414/796.5 |
| 6,307,389 B1 | * | 10/2001 | Buks .................. | G01R 1/07392 |
| | | | | 324/763.01 |
| 7,091,730 B1 | * | 8/2006 | Parshotam ......... | G01R 1/06705 |
| | | | | 324/763.01 |
| 9,653,332 B1 | * | 5/2017 | Tsironis ............ | H01L 21/67742 |

(Continued)

FOREIGN PATENT DOCUMENTS

| | | | | |
|---|---|---|---|---|
| JP | 55-112263 U | 8/1980 | | |
| WO | WO-2010119507 A1 | * | 10/2010 | ......... G01R 31/2887 |

(Continued)

OTHER PUBLICATIONS

International Search Report mailed on Aug. 31, 2021 in PCT/JP2021/022529 filed on Jun. 14, 2021 (2 pages).

*Primary Examiner* — Richard Isla

(74) *Attorney, Agent, or Firm* — Oblon, McClelland, Maier & Neustadt, L.L.P.

(57)　　　　　　ABSTRACT

This is an improvement of a measuring device, for example, it is possible to stably measure an electrical characteristic even when a component is small. In the present measuring device, at least one of a relative positional relationship between a main body and a loading stand for holding the component and a relative positional relationship between the main body and at least one of a pair of probes can be adjusted. Therefore, the component held on the loading stand can be more favorably gripped by the pair of probes, and the electrical characteristic can be stably measured even when the component is small.

6 Claims, 7 Drawing Sheets

(56) References Cited

U.S. PATENT DOCUMENTS

| | | | | |
|---|---|---|---|---|
| 9,958,477 | B2 * | 5/2018 | Hsu | G01R 1/06705 |
| 10,551,410 | B2 * | 2/2020 | Sawada | G01R 1/0416 |
| 2008/0007285 | A1 * | 1/2008 | Nakase | G01R 31/2893 |
| | | | | 324/756.07 |
| 2018/0172731 | A1 | 6/2018 | Lupashku et al. | |
| 2018/0203041 | A1 | 7/2018 | Sawada et al. | |
| 2018/0271001 | A1 | 9/2018 | Ito | |

FOREIGN PATENT DOCUMENTS

| | | | |
|---|---|---|---|
| WO | WO 2017/009987 | A1 | 1/2017 |
| WO | WO 2017/037887 | A1 | 3/2017 |

* cited by examiner

ADVANCE ⟵····· ·····⟶ RETREAT

56

36f

34f

44

46

34

52

56

36

34f

44

36f

46

34

RETREAT

ADVANCE

56

36

34f

44

36f

46

34

56

36

44

36f

31

46

52

34f

34 y x 36          46          44

57d

50

MEASURING DEVICE

TECHNICAL FIELD

The present disclosure relates to a measuring device that measures an electrical characteristic of a component to be mounted on a circuit board.

BACKGROUND ART

Patent Literature 1 describes a measuring device that is installed on a mounter for mounting a component supplied by a component supply device on a circuit board, and measures an electrical characteristic of the component, the device including a loading stand on which the component is loaded, and a pair of probes that are capable of approaching and separating from each other. In the measuring device described in Patent Literature 1, the electrical characteristic of the component is measured by sandwiching the component loaded on the loading stand between the pair of probes.

PATENT LITERATURE

Patent Literature 1: WO2017/009987

BRIEF SUMMARY

Technical Problem

A problem of the present disclosure is to improve a measuring device, and for example, to enable a stable measurement of an electrical characteristic of a component.

Solution to Problem

In the measuring device according to the present disclosure, at least one of a relative positional relationship of at least one of the pair of probes with respect to a main body and a relative positional relationship of the loading stand with respect to the main body can be adjusted. It is possible to adjust the relative positional relationship between the pair of probes, adjust the relative positional relationship between at least one of the pair of probes and the loading stand, and the like. As a result, the component can be more favorably gripped by the pair of probes, and the electrical characteristic of the component can be stably measured even when the component is small.

BRIEF DESCRIPTION OF DRAWINGS

FIGS. 9A to 9D are operation diagrams in a case where an electrical characteristic of the component is acquired in the measuring device, in which FIG. 9A is a diagram illustrating an initial state, FIG. 9B is a diagram illustrating a clamped state, FIG. 9C is a diagram illustrating a measurement state, and FIG. 9D is a diagram illustrating a disposal state.

FIG. 10 is a diagram illustrating a main part of a conventional measuring device.

DESCRIPTION OF EMBODIMENTS

Hereinafter, a mounter including a measuring device, which is an embodiment of the present disclosure, will be described in detail based on drawings.

Example 1

Figure 1:
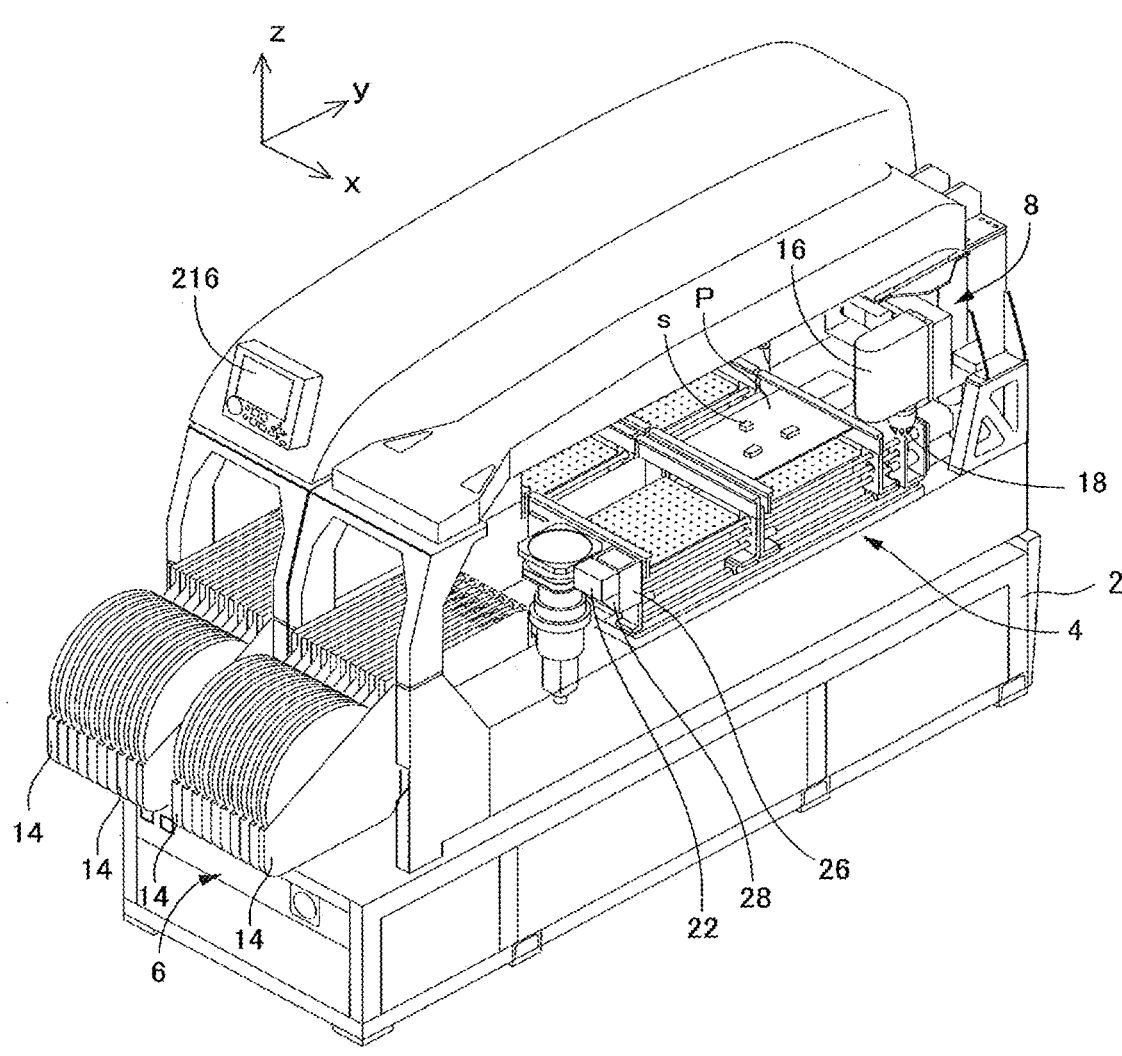
FIG. 1 is a perspective view of a mounter including a measuring device according to an embodiment of the present disclosure.

A mounter illustrated in FIG. 1 is intended to mount a component on a circuit board and includes main body 2, circuit board conveyance and holding device 4, component supply device 6, head moving device 8, and the like.

Circuit board conveyance and holding device 4 is intended to convey and hold circuit board P (hereinafter, referred simply to as board P) in a horizontal posture, and in FIG. 1, a conveyance direction of board P is referred to as an x direction, a width direction of board P is referred to as a y direction, and a thickness direction of board P is referred to as a z direction. The y direction is the front-rear direction of the mounter, and the z direction is the vertical direction. These x direction, y direction, and z direction are orthogonal to one another. Component supply device 6 is intended to supply electronic component (hereinafter, referred simply to as a component) s to be mounted on board P and includes multiple tape feeders 14 and the like. Head moving device 8 is intended to hold and move mounting head 16 in the x direction, y direction, and z direction, and mounting head 16 includes suction nozzle 18 that picks up and holds component s.

Reference numeral 22 denotes a measuring device. Measuring device 22 is intended to measure an electrical characteristic of component s. As the electrical characteristics of component s, L (inductance), C (capacitance), R (resistance), Z' (impedance), and the like correspond thereto, and one or more of these electrical characteristics are measured by measuring device 22.

Measuring device 22 is provided on a main body of circuit board conveyance and holding device 4 via collection box 26. Collection passage 28 is provided between collection box 26 and measuring device 22, and component s whose electrical characteristic is measured is accommodated in collection box 26 through collection passage 28.

As illustrated in FIGS. 2 to 6, measuring device 22 includes (i) main body 30, (ii) loading stand 32 on which component s is loaded, (iii) a pair of probes 37 including fixed element 34 and movable element 36, (iv) loading stand moving device 40 that moves loading stand 32, (v) movable element moving device 41 that causes movable element 36 to approach and separate from fixed element 34, (vi) electrical characteristics measuring section 42 (refer to FIG. 8) as an electrical characteristic acquisition section, and the like. In the present example, component s includes electrodes at both end portions, can be gripped by the pair of probes 37, and may be a square chip, for example. Main body 30 is provided with through hole 31 (refer to FIG. 9) which can communicate with collection passage 28. In addition, main body 30 is grounded.

For example, measuring device 22 can be attached to the main body of circuit board conveyance and holding device 4 such that the direction where movable element 36 approaches and separates from fixed element 34 is the y direction, and the direction orthogonal to an approaching and separating direction is the x direction. The y direction is substantially a horizontal direction, and movable element 36 approaches and separates from fixed element 34 by the movement in the horizontal direction. Hereinafter, the y direction may be referred to as an approaching and separating direction or a longitudinal direction of movable element 36 or groove section 46 formed in loading stand 32 described later. In addition, movement in a direction where movable element 36 approaches fixed element 34 may be referred to as an advance, and movement in a direction where movable element 36 separates from fixed element 34 may be referred to as a retreat. The same will apply to the movement of loading stand 32. Furthermore, the x direction may be referred to as a width direction of movable element 36 or groove section 46.

Loading stand 32 includes component loading section 44 and loading section holding body 45 for holding component loading section 44. Component loading section 44 is held by loading section holding body 45 so as to be integrally movable, and loading section holding body 45 is provided on main body 30 so as to be movable in the y direction (approaching and separating direction).

Groove section 46 extending in the approaching and separating direction is formed in component loading section 44. As illustrated in FIG. 6A, groove section 46 is substantially V-shaped and includes upper groove section 46a having a pair of inclined side surfaces, and lower groove section 46b provided at a lower portion of upper groove section 46a and having a substantially rectangular cross-section. Upper groove section 46a includes a pair of inclined surfaces 48a and 48b, and lower groove section 46b includes flat bottom surface 50 and a pair of wall surfaces 51a and 51b on both sides of bottom surface 50.

Component s loaded on component loading section 44 may be loaded on bottom surface 50 of lower groove section 46b or may be held by the pair of inclined surfaces 48a and 48b of upper groove section 46a and loaded thereon.

Cover portion 52 extending in the approaching and separating directions is attached to loading stand 32. Cover portion 52 includes a pair of side plates 52a and 52b positioned on both sides of groove section 46 of loading stand 32. The pair of side plates 52a and 52b is moved integrally with loading stand 32.

Fixed element 34 and movable element 36 have facing surfaces 34f and 36f facing each other, and component s is gripped by the pair of facing surfaces 34f and 36f. Fixed element 34 is fixed to main body 30 via fixed element holding body 55. Movable element 36 is held by movable element holding body 56 so as to be integrally movable, and movable element holding body 56 is provided on main body 30 so as to be movable in the y direction (approaching and separating direction). Fixed element holding body 55 and movable element holding body 56 are positioned on both sides of loading section holding body 45 in the approaching and separating direction. Each of fixed element 34 and movable element 36 is connected to electrical characteristics measuring section 42 via a copper wire.

Figure 3:
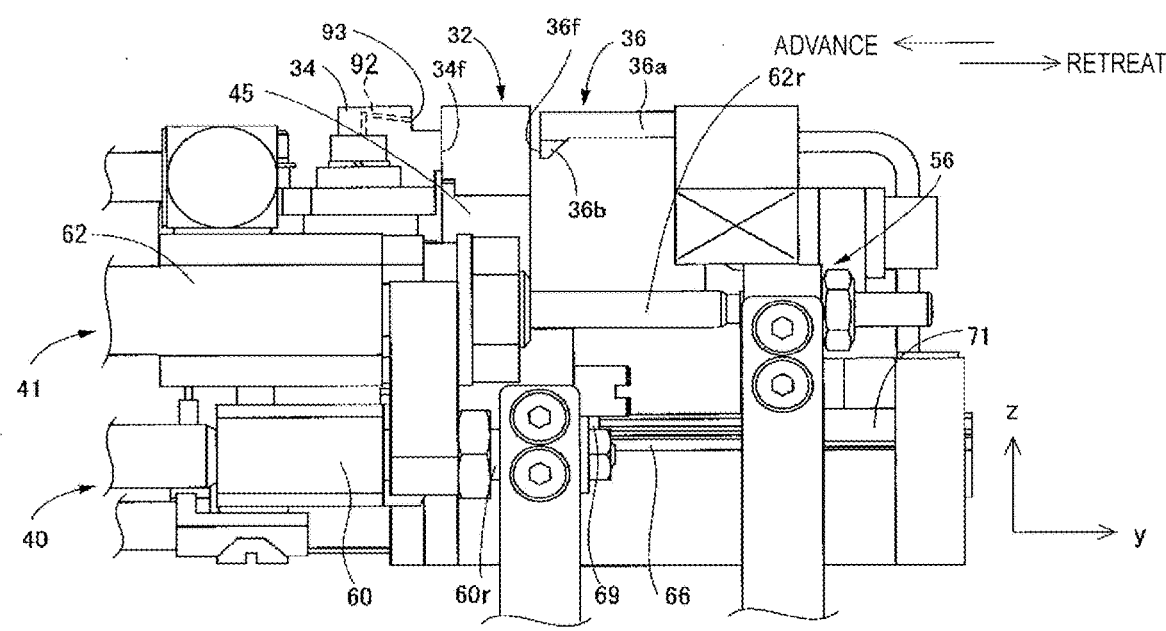
FIG. 3 is a side view of the main part of the measuring device.
Figure 4:
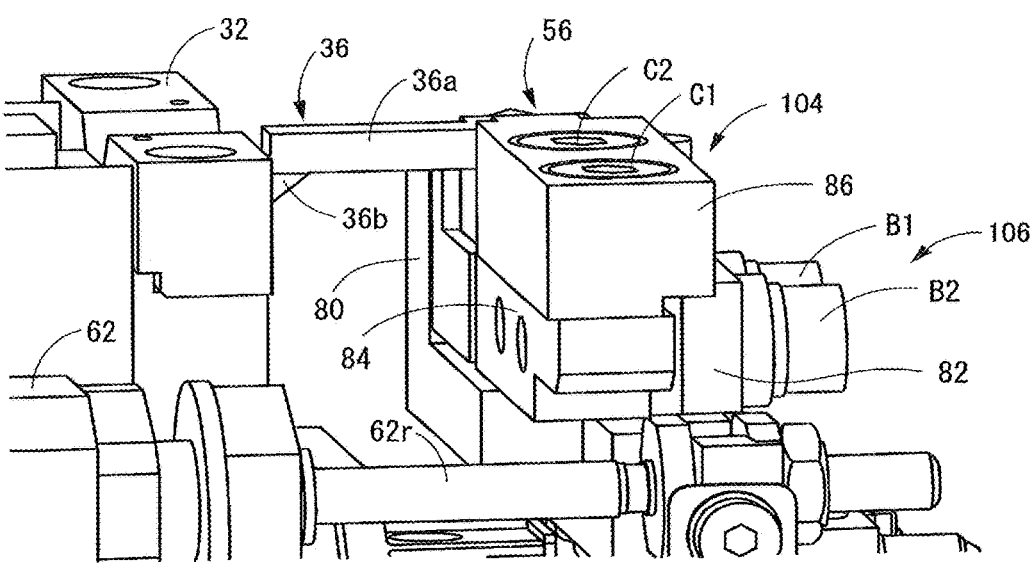
FIG. 4 is a perspective view of the main part of the measuring device.

As illustrated in FIGS. 3 and 4 and the like, movable element 36 includes main body portion 36a having a substantially rectangular parallelepiped shape, and protruding portion 36b protruding downward from a front portion of main body portion 36a. Movable element 36 is held by movable element holding body 56 at the rear portion of main body portion 36a, and protruding portion 36b and main body portion 36a constituting the front portion enter groove section 46 of component loading section 44. In the present example, a front end surface of protruding portion 36b of movable element 36, or a front end surface of protruding portion 36b and (a part of) a front end surface of main body portion 36a are facing surfaces 36f.

Main body portion 36a is provided in a posture in which the longitudinal direction of the rectangular parallelepiped body extends in the approaching and separating direction.

As illustrated in FIGS. 6B and 6C, protruding portion 36b has a size and a shape engageable with groove section 46. Protruding portion 36b includes lower groove engaging portion 57 engaged with lower groove section 46b and upper groove engaging portion 58 engaged with a part of upper groove section 46a. Upper groove engaging portion 58 includes a pair of inclined surfaces 58a and 58b facing a part of the pair of inclined surfaces 48a and 48b of groove section 46. Lower groove engaging portion 57 includes bottom surface 50 of lower groove section 46b, lower end surface 57d facing the pair of wall surfaces 51a and 51b, and a pair of side surfaces 57a and 57b. Main body portion 36a is separated from the pair of inclined surfaces 48a and 48b of groove section 46.

Figure 7:
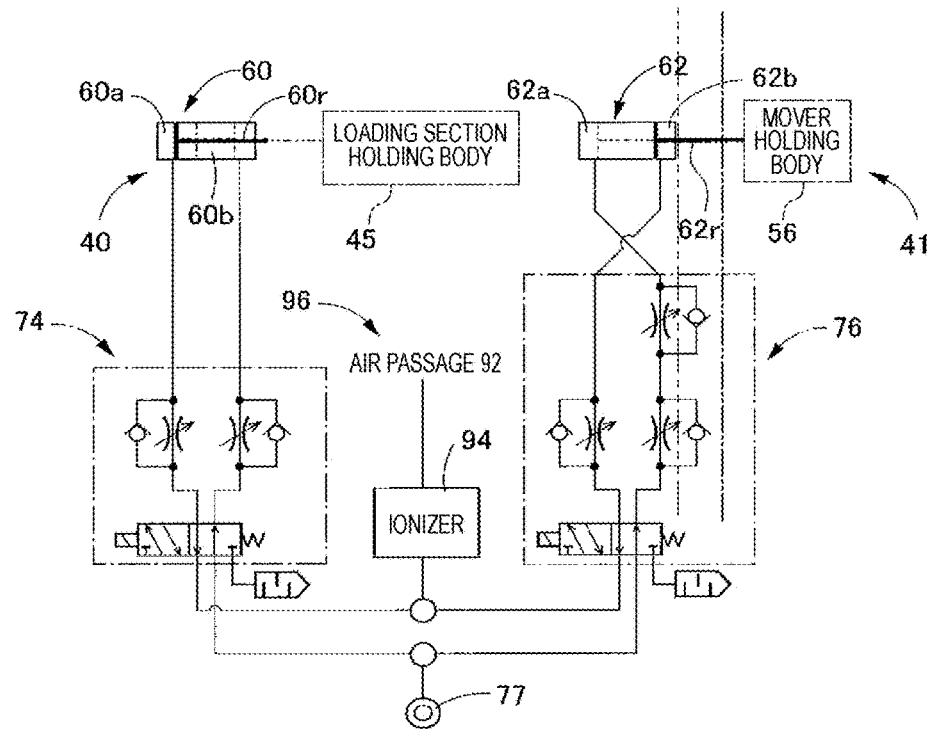
FIG. 7 is an air circuit diagram in the measuring device.

As illustrated in FIG. 3, each of loading stand moving device 40 and movable element moving device 41 includes air cylinders 60 and 62 as driving sources, a pair of guide rails 64 and 66 provided on main body 30, a pair of loading stand sliders 68 and 69 and a pair of movable element sliders 70 and 71 which are movably engaged with guide rails 64 and 66, solenoid valve devices 74 and 76 (refer to FIGS. 7 and 8), air source 77, and the like.

The pair of guide rails 64 and 66 is fixed to main body 30 in a posture extending in the y direction (approaching and separating direction) while being separated in the x direction (width direction of movable element 36). In addition, loading section holding body 45 is fixed to loading stand sliders 68 and 69. Movable element holding body 56 is fixed to movable element sliders 70 and 71. Furthermore, piston rod 60r (refer to FIG. 7) of air cylinder 60 is attached to loading section holding body 45, and piston rod 62r of air cylinder 62 is attached to movable element holding body 56. Air cylinders 60 and 62 are provided in a posture in which piston rods 60r and 62r extend in the approaching and separating directions.

Meanwhile, air passage 92 is provided in a member on the fixed element side (for example, an upper portion of fixed element 34, fixed element holding body 55, or the like). Air passage 92 includes opening 93 which opens in a portion of the member on the fixed element side which faces facing surface 36f of movable element 36. In addition, ionizer 94 is connected to air passage 92. Ionizer 94 is intended to ionize air by generating a corona discharge.

Solenoid valve device 74 is provided between two air chambers 60a and 60b of air cylinder 60, air source 77, air passage 92, and a filter (atmosphere). Movement of loading stand 32 or the like is controlled by the control of solenoid valve device 74.

Air source 77, air passage 92, and the filter (atmosphere) are selectively connected to air chambers 62*a* and 62*b* of air cylinder 62 via solenoid valve device 76. Movement or the like of movable element holding body 56 (movable element 36) is controlled by the control of solenoid valve device 76. In addition, when loading stand 32 is advanced and movable element 36 is retreated, air is supplied from air cylinders 60 and 62 to air passage 92 and is caused to flow out from opening 93.

In the present example, air passage 92, air source 77, air cylinders 60 and 62, and the like constitute air supply device 96. Air supply device 96 has elements common to movable element moving device 41 and loading stand moving device 40.

In the present example, movable element 36 is held by movable element holding body 56 so that a height which is a relative position in the vertical direction with respect to main body 30, a relative position in the width direction of movable element 36, and a relative inclination around axis Y extending in the approaching and separating direction can be adjusted. The vertical direction and the width direction of movable element 36 are orthogonal directions as directions intersecting the approaching and separating directions, and the width direction of movable element 36 of these directions is a substantially horizontal direction.

In the present example, the front portion of movable element 36 has a shape and size that can be engaged with groove section 46. In addition, movable element 36 is assembled to movable element holding body 56 in a state where the gap between movable element 36 and groove section 46 is significantly small. Therefore, even in a case where component s is loaded on bottom surface 50 of groove section 46, component s is gripped by facing surface 36*f* of movable element 36 and facing surface 34*f* of fixed element 34, and the electrical characteristic can be measured.

Figures 9A, 9B, 9C, 9D, 10:
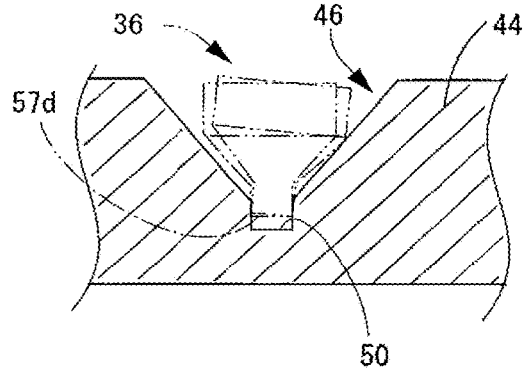

However, in a case where movable element 36 enters groove section 46 due to an assembly error or the like of movable element 36 with respect to movable element holding body 56, as illustrated in FIG. 10, a gap may be generated between movable element 36 and groove section 46, for example, between lower end surface 57*d* of movable element 36 and bottom surface 50 of groove section 46. Therefore, the pair of facing surfaces 34*f* and 36*f* cannot grip component s loaded on bottom surface 50, and the electrical characteristic cannot be measured, or component s cannot be favorably gripped, and the electrical characteristic cannot be measured with high accuracy.

Therefore, in the present example, the position of movable element 36 in the vertical direction with respect to main body 30, the position of movable element 36 in the width direction, and the inclination around axis Y can be adjusted, and thus the relative positional relationship between movable element 36 and groove section 46 of component loading section 44 can be adjusted.

Movable element holding body 56 includes holding body main body 78 fixed to the pair of movable element sliders 70 and 71, bracket 80 fixed to holding body main body 78, vertically movable member 82 attached to bracket 80 by two bolts A1 and A2, pivoting member 84 attached to vertically movable member 82 by bolts B1 and B2, and widthwise movable member 86 attached to pivoting member 84 by bolts C1 and C2.

Bolts A1 and A2 extend in the width direction of movable element 36, penetrate bracket 80, and are screwed to vertically movable member 82. Bolts B1 and B2 extend in the approaching and separating direction, penetrate vertically movable member 82, and are screwed to pivoting member 84. Bolts C1 and C2 extend in the vertical direction, penetrate widthwise movable member 86, and are screwed to pivoting member 84. In addition, movable element 36 is attached to widthwise movable member 86 by bolt M so as to be integrally movable.

In a case where the above-described bolt is loosened, the two members are capable of moving relative to each other, but in a case where the bolt is tightened, the two members are unable to move relative to each other. Hereinafter, this state where relative movement is impossible is simply referred to as a fixed state.

Bolts A1 and A2 are loosened in a state where widthwise movable member 86 is fixed to pivoting member 84 by bolts C1 and C2 and pivoting member 84 is fixed to vertically movable member 82 by bolts B1 and B2. Although the vertical relative movement of vertically movable member 82 with respect to bracket 80 is allowed by gap R1 between vertically movable member 82 and bracket 80 in the vertical direction, since outer side surface 82*a* of vertically movable member 82 and inner side surface 80*a* of bracket 80 abut on each other, movement of movable element 36 in the width direction of vertically movable member 82 with respect to bracket 80 is restricted.

Vertically movable member 82 is relatively moved along inner side surface 80*a* of bracket 80 in the vertical direction, and thus pivoting member 84, widthwise movable member 86, and movable element 36 are relatively moved integrally in the vertical direction, and the position of movable element 36 in the vertical direction is adjusted to tighten bolts A1 and A2. Accordingly, the position of movable element 36 in the vertical direction is adjusted within the range of the gap between bolts A1 and A2 and a through hole of bracket 80.

Bolts C1 and C2 are loosened in a state where vertically movable member 82 is fixed to bracket 80 by bolts A1 and A2, and pivoting member 84 is fixed to vertically movable member 82 by bolts B1 and B2. Accordingly, widthwise movable member 86 is movable relative to pivoting member 84 in the width direction of movable element 36. Widthwise movable member 86 is moved in the width direction along the upper surface of pivoting member 84 and the position of movable element 36 in the width direction is adjusted to tighten bolts C1 and C2. Accordingly, the position of movable element 36 in the width direction is adjusted within the range of the gap between bolts C1 and C2 and the through hole of widthwise movable member 86.

In addition, bolts B1 and B2 are loosened in a state where vertically movable member 82 is fixed to bracket 80 by bolts A1 and A2, and widthwise movable member 86 is fixed to pivoting member 84 by bolts C1 and C2. Pivoting member 84, widthwise movable member 86, and movable element 36 are caused to pivot around axis Y with respect to vertically movable member 82 due to gap R2 between widthwise movable member 86 and vertically movable member 82 in the vertical direction, the fact that pivoting member 84 is not held below, gap R3 between movable element 36 and vertically movable member 82 in the vertical direction, and the like.

Pivoting member 84 is pivoted, and the inclination of movable element 36 around axis Y is adjusted to tighten bolts B1 and B2. Accordingly, the inclination of movable element 36 around axis Y is adjusted within the range of the gap between bolts B1 and B2 and the through hole of vertically movable member 82.

Figure 2:
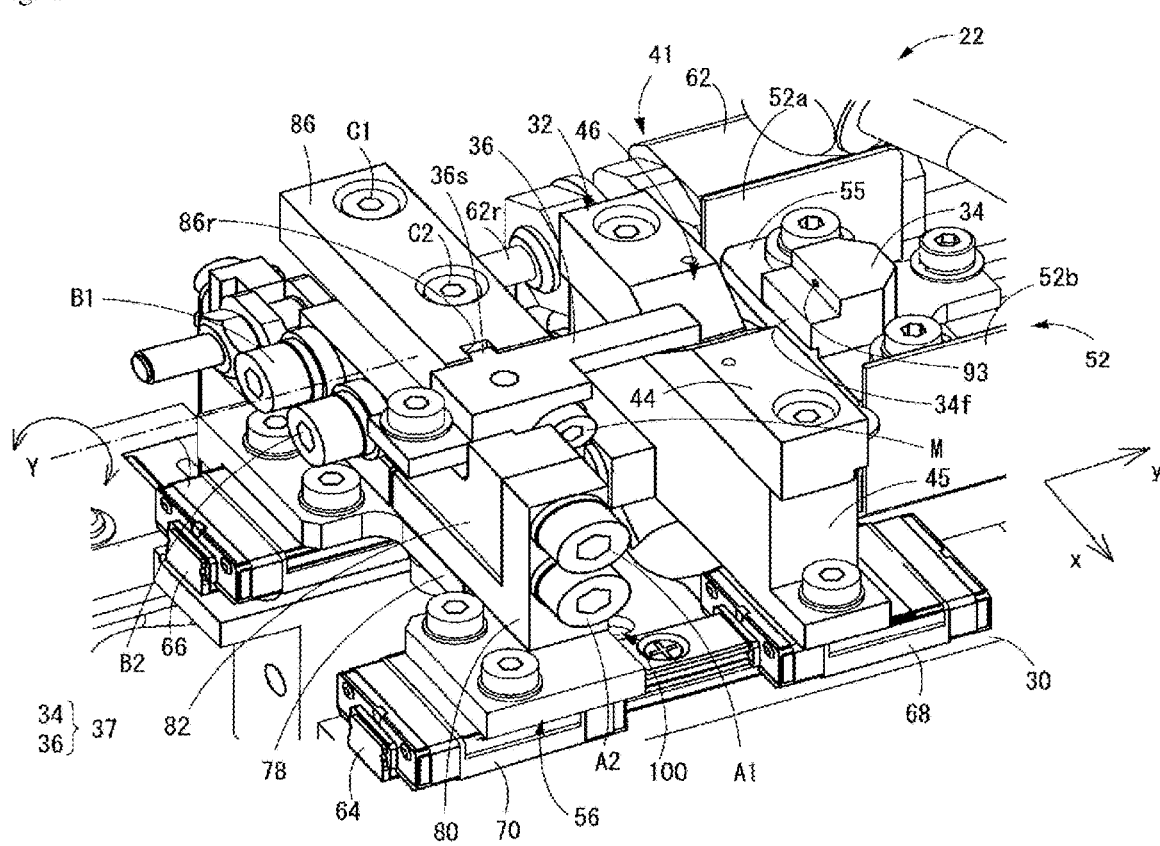
FIG. 2 is a perspective view of a main part of the measuring device.
Figure 5:
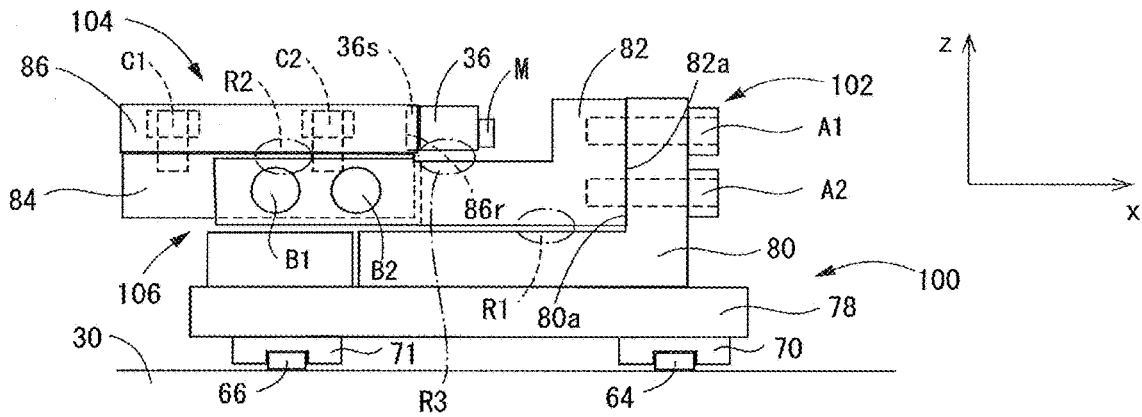
FIG. 5 is a rear view of the main part of the measuring device.
Figure 6:
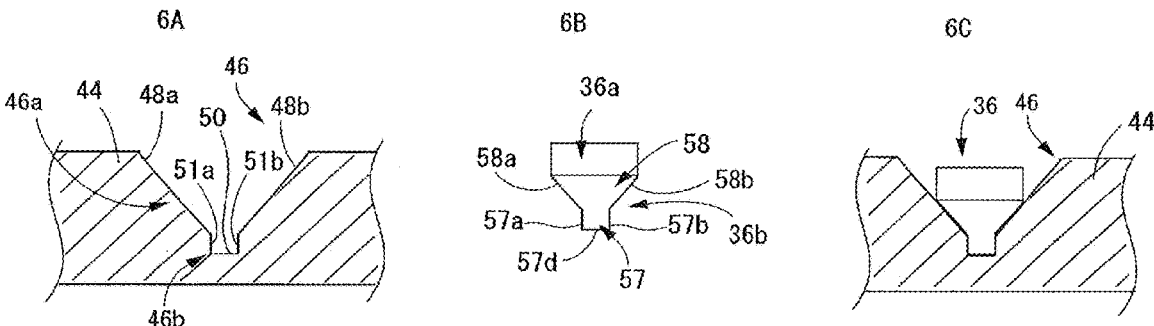
FIG. 6A is a cross-sectional view of a groove section of a loading stand of the measuring device.
FIG. 6B is a front view of a movable element of the measuring device.
FIG. 6C is a view illustrating a state where the movable element enters the groove section of the loading stand of the measuring device.

Although movable element 36 is fixed to widthwise movable member 86 by bolt M, as illustrated in FIGS. 2 and 5 and the like, protruding portion 36s provided on a side surface of movable element 36 and extending in the vertical direction is fitted into recessed portion 86r provided on widthwise movable member 86 and extending in the vertical direction. Therefore, in a state where bolt M is loosened, movable element 36 can move in the vertical direction relative to widthwise movable member 86. The position of movable element 36 in the vertical direction can also be adjusted by the movement of movable element 36 in the vertical direction with respect to widthwise movable member 86.

For example, in a state where movable element 36 enters groove section 46 of loading stand 32, these operations can be performed by an operator by measuring the gaps between movable element 36 and groove section 46 using a jig such as a dial gauge and a strain gauge so as to reduce the gaps.

Figure 8:
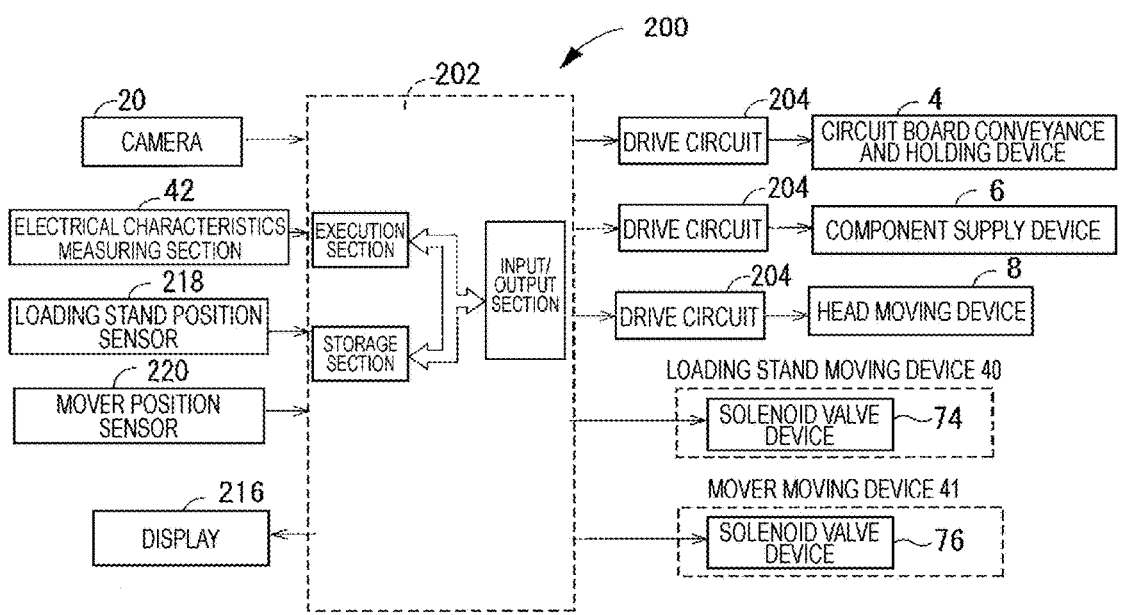
FIG. 8 is a block diagram conceptually illustrating a periphery of a control device of the measuring device.

The mounter includes control device 200. As illustrated in FIG. 8, control device 200 includes controller 202 mainly including a computer, and multiple drive circuits 204. Each of circuit board conveyance and holding device 4, component supply device 6, and head moving device 8 is connected to controller 202 via drive circuit 204, and solenoid valve devices 74 and 76 of loading stand moving device 40 and movable element moving device 41 are connected to controller 202. In addition, camera 20, electrical characteristics measuring section 42, display 216, loading stand position sensor 218, movable element position sensor 220, and the like are connected. Solenoid valve devices 74 and 76 are controlled based on output signals of loading stand position sensor 218 and movable element position sensor 220, and the like. In addition, the measurement result of the electrical characteristic of component s can be displayed on display 216.

In measuring device 22 of the mounter configured as described above, an operation in a case where the electrical characteristic of component s is measured will be described.

Measuring device 22 is normally in an initial state illustrated in FIG. 9A. Movable element 36 is at a retreated end position and loading stand 32 is at an advanced end position. When an instruction to measure the electrical characteristic of component s is issued, mounting head 16 is moved. Component s is held and moved to be loaded in groove section 46 by suction nozzle 18.

Movable element 36 is caused to advance by the control of solenoid valve device 76, and component s is clamped by movable element 36 and fixed element 34 as illustrated in FIG. 9B. Next, as illustrated in FIG. 9C, loading stand 32 is retreated by the control of solenoid valve device 74. Loading stand 32 is retreated to a position separated from component s and the pair of probes 37, in other words, a position where protruding portion 36b of movable element 36 is separated from groove section 46.

Meanwhile, the electrical characteristic of component s is measured after the elapse of the static electricity removal time which is the set time from the time when component s is loaded on groove section 46. The static electricity removal time is a time during which static electricity charged on component s is removed, and is determined in advance. After the measurement of the electrical characteristic of component s is completed, movable element 36 is caused to retreat, and component s gripped between movable element 36 and fixed element 34 is released. In addition, as movable element 36 retreats, the air is supplied obliquely from above to facing surface 36f of movable element 36 from opening 93.

Next, as illustrated in FIG. 9D, movable element 36 is further retreated, and loading stand 32 is retreated. Since the space between movable element 36 and fixed element 34 communicates with collection passage 28, component s can be collected into collection box 26. Thereafter, loading stand 32 is advanced and positioned between the pair of facing surfaces 34f and 36f. A space is defined above groove section 46, component s can be loaded therein, and measuring device 22 is restored to the initial state illustrated in FIG. 9A. In addition, since air containing ions is supplied to facing surface 36f of movable element 36 as loading stand 32 advances, it is also possible to remove static electricity from facing surface 36f.

As described above, in the present example, since the relative positional relationship of movable element 36 with respect to component loading section 44 can be adjusted, the gap between protruding portion 36b of movable element 36 and groove section 46 can be made small or close to zero. As a result, even when component s is small, component s can be favorably gripped by the pair of facing surfaces 34f and 36f of movable element 36 and fixed element 34. As a result, the electrical characteristic of component s can be stably measured, and a decrease in measurement accuracy can be suppressed.

In addition, component loading section 44 is in a state of being electrically conducted to main body 30 via loading section holding body 45 and guide rails 64 and 66, and movable element 36 is in a state of being electrically conducted to main body 30 via movable element holding body 56 and guide rails 64 and 66. Therefore, the static electricity removal of component s and the static electricity removal of loading stand 32, movable element 36, and the like are favorably performed. Therefore, the electrical characteristic of component s can be stably measured. Even when component s has a small impedance, the impedance of component s can be measured with high accuracy.

Furthermore, since two bolts are used in a case where the position and the posture of movable element 36 are fixed, the position and the posture can be favorably fixed than in the case of one bolt.

Hereinbefore, in the present example, bracket 80, vertically movable member 82, pivoting member 84, widthwise movable member 86, bolts A1, A2, B1, B2, C1, and C2, recessed portion 86r provided in widthwise movable member 86, protruding portion 36s provided in movable element 36, and the like constitute adjustment mechanism 100. In a case where the first direction is the vertical direction, vertically movable member 82 and the like correspond to the first movable member, bracket 80 and the like correspond to the first holding member, bolts A1 and A2 and the like correspond to the first fixing device, and vertically movable member 82, bracket 80, bolts A1 and A2, a structure in which vertically movable member 82 is relatively movable in the vertical direction, and the like constitute vertical adjustment mechanism 102 as the first adjustment mechanism. In a case where the first direction is the width direction of movable element 36, widthwise movable member 86 and the like correspond to the first movable member, pivoting member 84 and the like correspond to the first holding member, bolts C1 and C2 and the like correspond to the first fixing device, and widthwise movable member 86, pivoting member 84, bolts C1 and C2 and the like, a structure in which widthwise movable member 86 is relatively movable in the width direction, and the like constitute widthwise adjustment mechanism 104 as the first adjustment mechanism. In a case where the second direction is a direction parallel to the approaching and separating direction, pivoting member 84 and the like correspond to the second movable member, vertically movable member 82 and the like correspond to the second holding member, bolts B1 and B2 and the like correspond to the second fixing device, and pivoting member 84, vertically movable member 82, bolts B1 and B2 and the like, a structure in which pivoting member 84 is pivotable around axis Y, and the like constitute second adjustment mechanism 106. Movable element 36 and the like constitute the first movable member, widthwise movable member 86 and the like constitute the first holding member, and bolt M and the like constitute the first fixing device, and movable element 36, widthwise movable member 86, bolt M, recessed portion 86r, protruding portion 36s, and the like constitute the vertical adjustment mechanism as the first adjustment mechanism.

Example 2

In the measuring device according to Example 1, although the relative inclination of movable element around axis Y, which extends in the direction parallel to the approaching and separating direction as the second direction, is adjustable, in the present example, the relative inclination of movable element 36 around axis X, which extends in the width direction of movable element 36 as the orthogonal direction as the direction intersecting the approaching and separating directions as the second direction, is adjustable.

In the measuring device according to Example 2, since the basic structure of the measuring device according to Example 1 is the same, the corresponding elements are denoted by the same reference numerals, and the description thereof will be omitted. In Example 2, a movable element holding body including an adjustment mechanism will be described.

Figure 11:
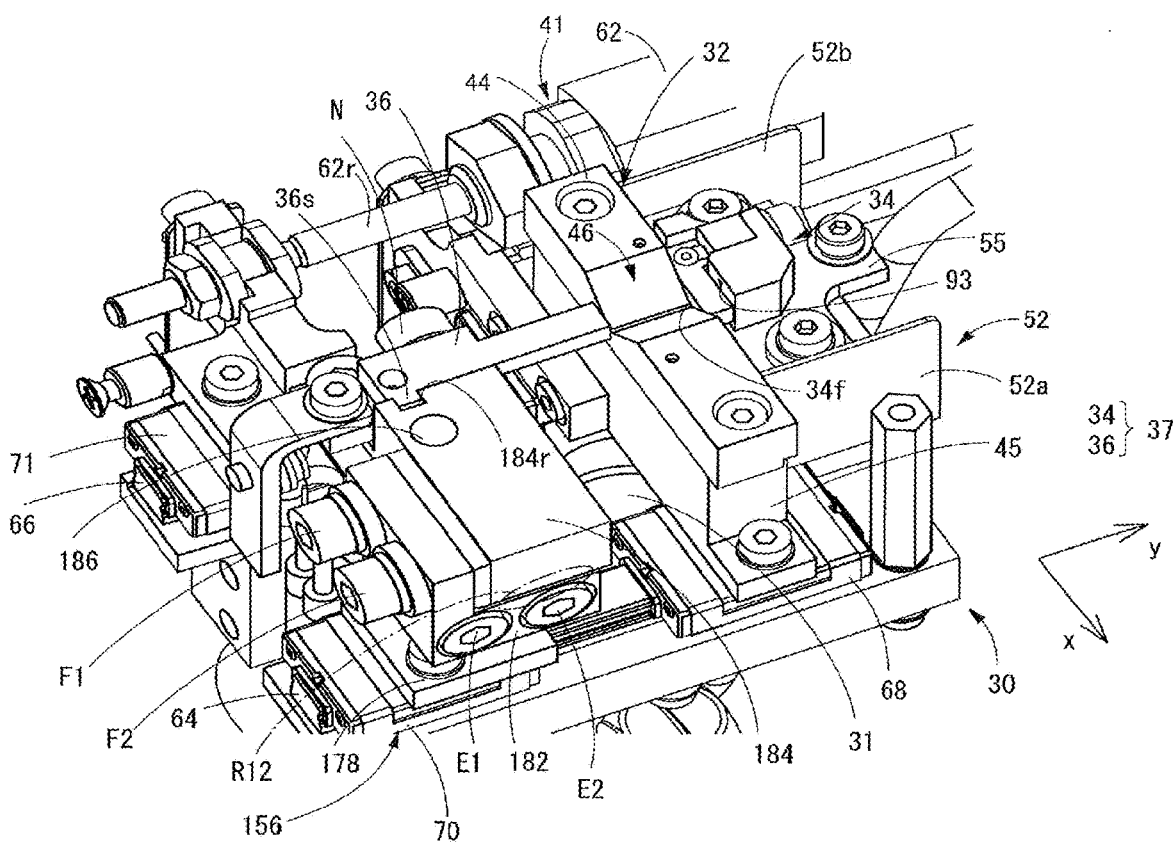
FIG. 11 is a perspective view illustrating a main part of a measuring device according to Example 2 of the present disclosure.
Figure 12:
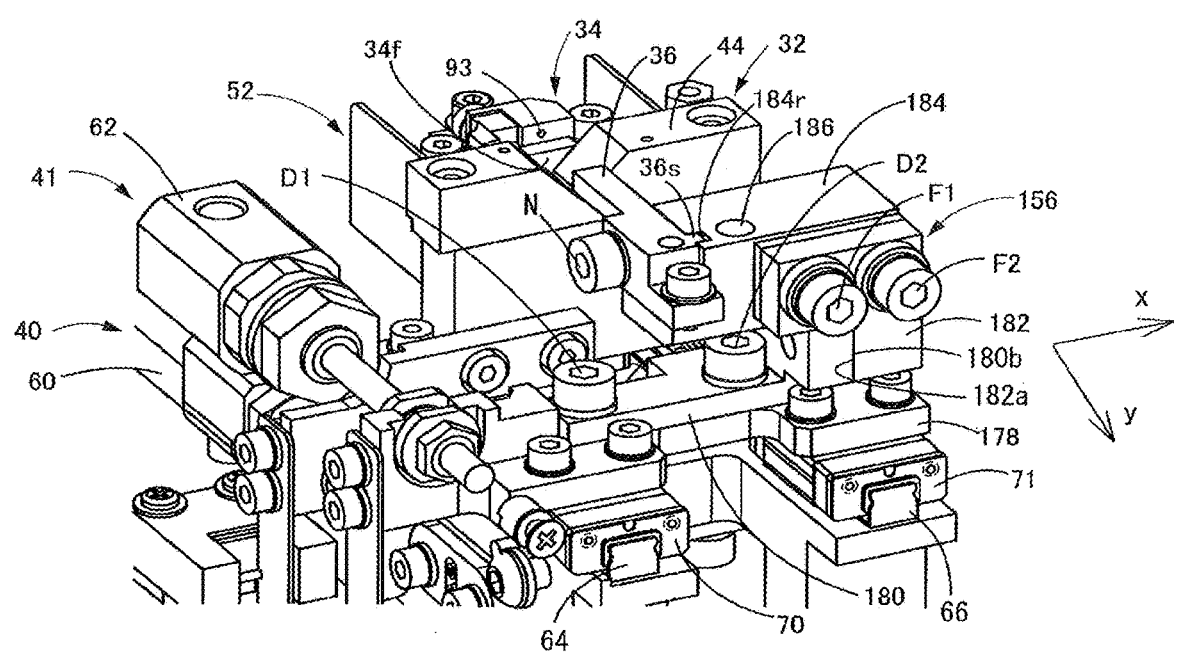
FIG. 12 is another perspective view illustrating the main part of the measuring device.
Figure 13:
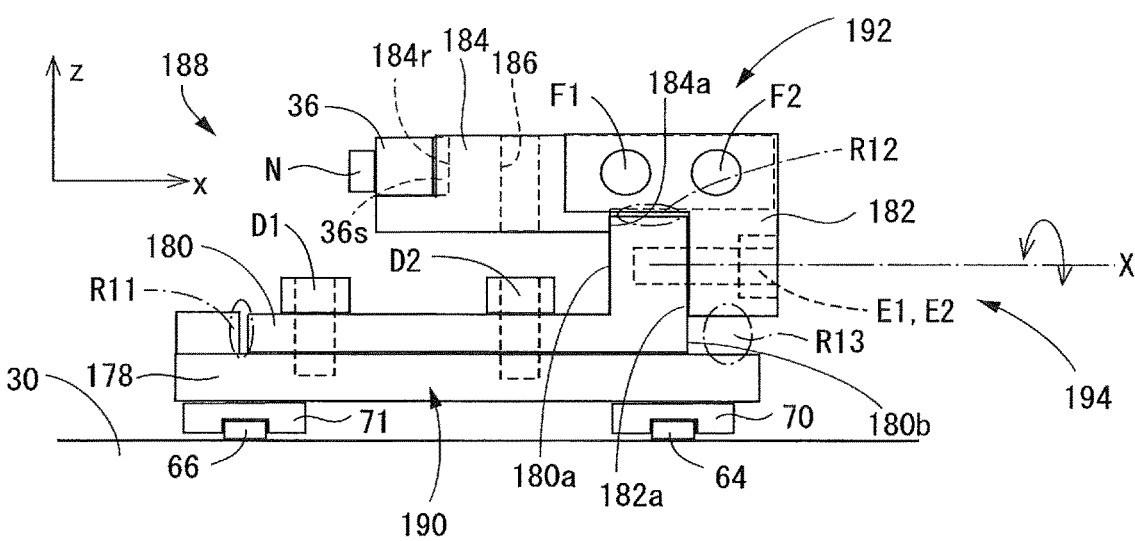
FIG. 13 is a rear view of the main part of the measuring device.

In FIGS. 11 to 13, movable element holding body 156 includes holding body main body 178 fixed to the pair of movable element sliders 70 and 71, widthwise movable member 180 attached to holding body main body 178 by two bolts D1 and D2, pivoting member 182 attached to widthwise movable member 180 by bolts E1 and E2, and vertically movable member 184 attached to pivoting member 182 by bolts F1 and F2. Movable element 36 is attached to vertically movable member 184 by bolt N so as to be integrally movable.

Bolts D1 and D2 are loosened in a state where pivoting member 182 is fixed to widthwise movable member 180 by bolts E1 and E2 and vertically movable member 184 is fixed to pivoting member 182 by bolts F1 and F2. Widthwise movable member 180, pivoting member 182, vertically movable member 184, and movable element 36 are integrally movable in the width direction of movable element 36. Since widthwise movable member 180 and holding body main body 178 are provided with gap R11 therebetween in the x direction, widthwise movable member 180 is caused to move in the x direction with respect to holding body main body 178.

By moving widthwise movable member 180 and the like in the x direction along the upper surface of movable element holding body main body 178, the position of movable element 36 in the width direction is adjusted, and bolts D1 and D2 are tightened. The position of movable element 36 in the width direction can be adjusted within the range of the gap between bolts D1 and D2 and the through hole of widthwise movable member 180. The operation of bolt D2 is performed using through hole 186 in the vertical direction provided in vertically movable member 184. The jig is passed via through hole 186 and engaged with the head of bolt D2 to loosen or tighten bolt D2.

Bolts F1 and F2 are loosened in a state where widthwise movable member 180 is fixed to holding body main body 178 by bolts D1 and D2 and pivoting member 182 is fixed to widthwise movable member 180 by bolts E1 and E2. Accordingly, vertically movable member 184 and movable element 36 are movable in the vertical direction with respect to pivoting member 182 and widthwise movable member 180. The vertical movement of vertically movable member 184 is allowed by gap R12 in the vertical direction between vertically movable member 184, widthwise movable member 180, and pivoting member 182. In addition, since step surface 184a of vertically movable member 184 and inner side surface 180a of widthwise movable member 180 abut on each other, the movement of vertically movable member 184 in the x direction is restricted.

Vertically movable member 184 and the like are moved in the vertical direction along widthwise movable member 180 and the height which is the position of movable element 36 in the vertical direction is adjusted to tighten bolts F1 and F2. The position of movable element 36 in the vertical direction can be adjusted within the range of the gap between bolts F1 and F2 and the through hole of pivoting member 182.

Bolts E1 and E2 are loosened in a state where widthwise movable member 180 is fixed to holding body main body 178 by bolts D1 and D2 and vertically movable member 184 is fixed to pivoting member 182 by bolts F1 and F2. Accordingly, pivoting member 182, vertically movable member 184, and movable element 36 are pivotable around axis X with respect to widthwise movable member 180. Pivoting member 182 is caused to pivot around axis X by gap R13 between pivoting member 182 and holding body main body 178, and gap R12 between pivoting member 182 and widthwise movable member 180. In addition, since inner side surface 182a of pivoting member 182 and outer side surface 180b of widthwise movable member 180 abut on each other, the movement of pivoting member 182 in the x direction is restricted.

When pivoting member 182 (and vertically movable member 184 and movable element 36) is pivoted around axis X, the inclination of movable element 36 relative to main body 30 around axis X is adjusted to tighten bolts E1 and E2. Accordingly, the inclination of movable element 36 around axis X can be adjusted.

Although movable element 36 is fixed to vertically movable member 184 by bolt N, protruding portion 36s provided on a side surface of movable element 36 and extending in the vertical direction is fitted into recessed portion 184r provided on vertically movable member 184 and extending in the vertical direction. Therefore, in a state where bolt N is loosened, movable element 36 can move in the vertical direction relative to vertically movable member 184. The position of movable element 36 in the vertical direction can also be adjusted by moving movable element 36 in the vertical direction with respect to vertically movable member 184.

In the present example, widthwise movable member 180, pivoting member 182, vertically movable member 184, bolt N, bolts D1 and D2, bolts E1 and E2, bolts F1 and F2, protruding portion 36s provided on movable element 36, recessed portion 184r provided on vertically movable member 184, and the like constitute adjustment mechanism 188. In addition, in the case where the first direction is the width direction of movable element 36 as the orthogonal direction, which is the direction intersecting the approaching and separating direction, widthwise movable member 180 and the like correspond to the first movable member, holding body main body 178 corresponds to the first holding member, bolts D1 and D2 and the like correspond to the first fixing device, and widthwise movable member 180, holding body main body 178, bolts D1 and D2, and the like constitute widthwise adjustment mechanism 190 as the first adjustment mechanism. In the case where the first direction is the vertical direction as the orthogonal direction, which is the direction intersecting the approaching and separating direction, vertically movable member 184 and the like correspond to the first movable member, pivoting member 182 and the like correspond to the first holding member, bolts F1 and F2 and the like correspond to the first fixing device, and vertically movable member 184, pivoting member 182, bolts F1 and F2, and the like constitute vertical adjustment mechanism 192 as the first adjustment mechanism. In addition, in the case where the second direction is the width direction of movable element 36 as the orthogonal direction, which is the direction intersecting the approaching and separating direction, pivoting member 182 and the like correspond to the second movable member, widthwise movable member 180 and the like correspond to the second holding member, bolts E1 and E2 and the like correspond to the second fixing device, and pivoting member 182, widthwise movable member 180, bolts E1 and E2, and the like constitute second adjustment mechanism 194. Movable element 36 and the like constitute the first movable member, vertically movable member 184 and the like constitute the first holding member, bolt N and the like constitute the first fixing device, and movable element 36, vertically movable member 184, bolt N, recessed portion 184r, protruding portion 36s, and the like constitute the vertical adjustment mechanism as the first adjustment mechanism.

In addition, in the above example, although the relative positional relationship between movable element 36 and component loading section 44 is adjusted by adjusting the relative positional relationship of movable element 36 with respect to main body 30, by adjusting the relative positional relationship between component loading section 44 and main body 30, the relative positional relationship between movable element 36 and groove section 46 of component loading section 44 can be adjusted.

Furthermore, the second adjustment mechanism may include a mechanism that adjusts a relative inclination of the movable element around an axis extending in a vertical direction as the orthogonal direction, which is the direction intersecting the approaching and separating direction.

In addition, the structure of the measuring device is not limited to the structure of the measuring device in the above examples, such as the first fixing device and the second fixing device which are elements of the adjustment mechanism are not limited to those including two bolts, and may include three or more bolts.

Hereinbefore, in addition to the aspects described in the embodiments, the present disclosure can be implemented with various changes and improvements based on the knowledge of those skilled in the art.

REFERENCE SIGNS LIST

22: Measuring device, 30: Main body, 32: Loading stand, 34: Fixed element, 36: Movable element, 40: Loading stand moving device, 41: Movable element moving device, 42: Electrical characteristics measuring section, 44: Component loading section, 46: Groove section, 56 and 156: Movable element holding body, 82 and 184: Vertically movable member, 86 and, 180: Widthwise movable member, 84 and 182: Pivoting member, A1, A2, B1, B2, C1, C2, D1, D2, E1, E2, F1, and F2: Bolt, 100 and 188: Adjustment mechanism, 102 and 192: Vertical adjustment mechanism, 104 and 190: Widthwise adjustment mechanism, 106 and 194: Second adjustment mechanism

SUPPLEMENTARY DESCRIPTION

In the first adjustment mechanism, in a case where the first direction is an orthogonal vertical direction, which is the direction intersecting the approaching and separating directions, the first movable member is the vertically movable member that is movable in the vertical direction, and the second holding member is the vertically holding member that holds the vertically movable member so as to be relatively movable in the vertical direction, the first adjustment mechanism may be referred to as a vertical position adjustment mechanism. In addition, in a case where the first direction is the width direction of the movable element orthogonal to the approaching and separating direction as an intersection and orthogonal to the vertical direction, the first movable member is the widthwise movable member that is movable in the width direction, and the second holding member is the widthwise holding member that holds the widthwise movable member so as to be relatively movable in the width direction, the first adjustment mechanism may be referred to as a widthwise position adjustment mechanism.

The second adjustment mechanism may have a second direction where is a horizontal direction, and may adjust a relative inclination around an axis extending in the horizontal direction or may adjust a relative inclination around an axis extending in the vertical direction. Examples of the axis extending in the horizontal direction include an axis extending in a direction parallel to the approaching and separating direction, and an axis extending in the width direction of the movable element or the groove section orthogonal to the approaching and separating direction.

The invention claimed is:

1. A measuring device to be installed on a mounter for mounting a component supplied by a component supply device on a circuit board, the measuring device for measuring an electrical characteristic of the component, the measuring device comprising:

a main body;

a loading stand provided on the main body and including a groove section on which the component is loaded;

a pair of probes provided in the main body and configured to approach and separate from each other, the pair of probes including a fixed element and a movable element that approaches and separates from the fixed element in an approaching and separating direction to grip the component loaded on the groove section and to measure the electrical characteristic of the component; and an adjustment mechanism configured to adjust a relative positional relationship between the loading stand and the movable element, the adjustment mechanism including a second adjustment mechanism configured to adjust a relative inclination of the movable element with respect to the main body around an axis extending in a direction parallel to the approaching and separating direction or an axis extending in a direction intersecting the approaching and separating direction, wherein the second adjustment mechanism includes a second pivoting member that is pivotable around the axis integrally with the movable element, a second holding member configured to hold the second pivoting member so as to be relatively pivotable around the axis, and a second fixing device configured to fix the second pivoting member to the second holding member.

2. The measuring device according to claim 1, wherein the adjustment mechanism adjusts at least one of a relative positional relationship between at least one of the pair of probes and the main body and a relative positional relationship between the loading stand and the main body.

3. The measuring device according to claim 1, wherein the groove section extends in the approaching and separating direction, and the adjustment mechanism adjusts a relative positional relationship between at least one of the pair of probes and the groove section of the loading stand.

4. The measuring device according to claim 1, wherein the adjustment mechanism adjusts at least one of a relative position in a direction intersecting an approaching and separating direction which is a direction of the approaching and separating, between the movable element and the loading stand, a relative inclination around an axis parallel to the approaching and separating direction, and a relative inclination around an axis intersecting the approaching and separating direction.

5. The measuring device according to claim 4, wherein the movable element is provided on the main body via a movable element holding body so as to be movable in the approaching and separating direction which is the direction of the approaching and separating, and the adjustment mechanism is provided on the movable element holding body and adjusts a relative positional relationship of the movable element with respect to the main body.

6. The measuring device according to claim 1, wherein the adjustment mechanism includes a first adjustment mechanism configured to adjust a relative position of the movable element with respect to the main body in a first direction which is a direction intersecting the approaching and separating direction, and the first adjustment mechanism includes a first movable member movable in the first direction integrally with the movable element, a first holding member configured to hold the first movable member so as to be relatively movable in the first direction, and a first fixing device configured to fix the first movable member to the first holding member.

* * * * *